United States Patent
Hanania et al.

(10) Patent No.: US 12,352,922 B2
(45) Date of Patent: Jul. 8, 2025

(54) ON-CHIP PHASE MODULATING THIN FILM OPTICAL ELEMENTS

(71) Applicant: Samsung Electronics Co., Ltd., Suwon-si (KR)

(72) Inventors: Haeri Park Hanania, Sierra Madre, CA (US); Radwanul Hasan Siddique, Monrovia, CA (US); Yibing Michelle Wang, Temple City, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 532 days.

(21) Appl. No.: 17/699,071

(22) Filed: Mar. 18, 2022

(65) Prior Publication Data

US 2023/0228909 A1 Jul. 20, 2023

Related U.S. Application Data

(60) Provisional application No. 63/299,913, filed on Jan. 14, 2022.

(51) Int. Cl.
| | | |
|---|---|---|
| G02B 1/00 | (2006.01) | |
| G02B 1/02 | (2006.01) | |
| G02F 1/29 | (2006.01) | |

(52) U.S. Cl.
CPC .............. G02B 1/002 (2013.01); G02B 1/02 (2013.01); G02F 1/29 (2013.01)

(58) Field of Classification Search
None
See application file for complete search history.

(56) References Cited

U.S. PATENT DOCUMENTS

| | | | |
|---|---|---|---|
| 9,116,302 | B2 | 8/2015 | McCarthy et al. |
| 10,591,643 | B2 | 3/2020 | Lin et al. |
| 10,705,406 | B2 | 7/2020 | Kim et al. |
| 2017/0082263 | A1 | 3/2017 | Byrnes et al. |
| 2019/0044003 | A1 | 2/2019 | Heck et al. |

(Continued)

FOREIGN PATENT DOCUMENTS

| | | |
|---|---|---|
| CN | 217278989 U | 8/2022 |
| CN | 217820944 U | 11/2022 |

(Continued)

OTHER PUBLICATIONS

Mikheeva, E. et al., "CMOS-Compatible All-Dielectric Metalens for Improving Pixel Photodetector Arrays," APL Photonics 5, 116105, 2020, 9 pages.

(Continued)

*Primary Examiner* — Thanh Nhan P Nguyen
(74) *Attorney, Agent, or Firm* — Renaissance IP Law Group LLP

(57) ABSTRACT

A thin-film optical device disclosed herein includes a metalens able to modulate the phase of incident light. The metalens includes a thin-film layer having a first index of refraction, an embedded layer within the thin-film layer, and the embedded layer having a second index of refraction greater than or equal to 1.5 and less than or equal to 3.0 times the first index of refraction. The embedded layer may fill a plurality of holes formed on the thin film layer, with the depth, width, and spacing of holes all contribute to modulating the phase of light traveling through the metalens.

19 Claims, 11 Drawing Sheets

(56) References Cited

U.S. PATENT DOCUMENTS

| | | |
|---|---|---|
| 2020/0321378 A1 | 10/2020 | Paiella et al. |
| 2021/0014394 A1* | 1/2021 | Han ...................... G02B 5/286 |
| 2021/0037219 A1 | 2/2021 | Colburn et al. |
| 2021/0190593 A1 | 6/2021 | Yao et al. |
| 2021/0223104 A1 | 7/2021 | Siddique et al. |
| 2021/0263190 A1 | 8/2021 | Li et al. |
| 2022/0109287 A1 | 4/2022 | Lenef et al. |
| 2022/0137259 A1 | 5/2022 | Greco et al. |

FOREIGN PATENT DOCUMENTS

| | | |
|---|---|---|
| CN | 217821068 U | 11/2022 |
| KR | 20210006842 A | 1/2021 |
| WO | 2018007661 A1 | 1/2018 |
| WO | 2020200931 A1 | 10/2020 |
| WO | 2020242384 A1 | 12/2020 |

OTHER PUBLICATIONS

Zou, Xiujuan et al., "Imaging Based on Metalenses," PhotoniX 1, Article No. 2, 2020, 24 pages.

Chen, Wei Ting et al., "Flat Optics with Dispersion-Engineered Metasurfaces," Nature Reviews Materials, vol. 5, Aug. 2020, pp. 604-620.

European Extended Search Report for Application No. 23150681.7, mailed May 22, 2023.

Yilmaz, Nazmi et al., "High Efficiency Nanohole Based Immersion Metalens for Light Concentration," Proceedings of SPIE, vol. 11795, Metamaterials, Metadevices, and Metasystems 2021, 2021, 6 pages.

European Office Action for Application No. 23150681.7, mailed Oct. 30, 2024.

Panov, Andrey V., "Optical Kerr Nonlinearity of Dielectric Nanohole Array Metasurface in Proximity to Anapole State," Optic Letters, vol. 47, No. 11, Jun. 2022, 6 pages.

* cited by examiner

View A-A'

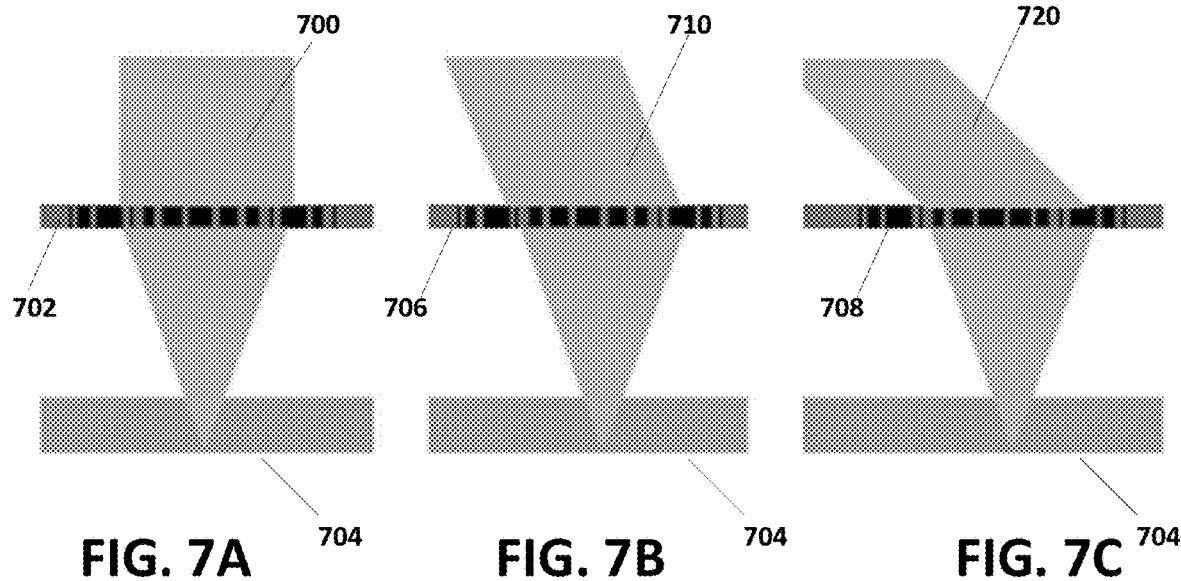
FIG. 7A   FIG. 7B   FIG. 7C
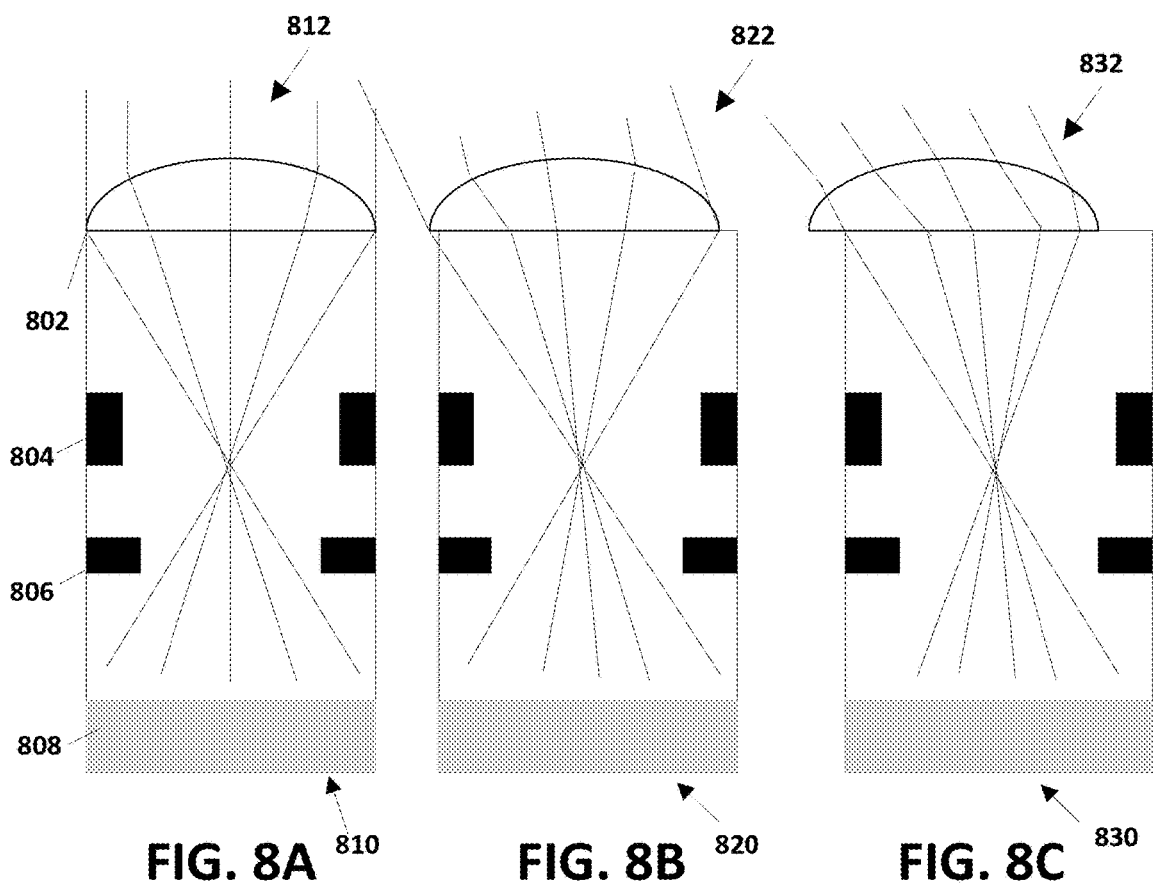
FIG. 8A   FIG. 8B   FIG. 8C

ON-CHIP PHASE MODULATING THIN FILM OPTICAL ELEMENTS

CROSS-REFERENCE TO RELATED APPLICATION

This application claims the priority benefit under 35 U.S.C. § 119(e) of U.S. Provisional Application No. 63/299,913, filed on Jan. 14, 2022, the disclosure of which is incorporated herein by reference in its entirety.

TECHNICAL FIELD

The subject matter disclosed herein relates to optics. More particularly, the subject matter disclosed herein relates to a technique for creating thin film optics using arrays of nanoscale and microscale holes and pillars.

BACKGROUND

Image sensor pixels vary greatly in their effectiveness, due to differences within the optics and position within an array, thereby creating difficulties in matching lens arrays for performance as each pixel may require different surface curvatures to produce focus light.

SUMMARY

An example embodiment provides a metalens including a first thin-film layer having a first index of refraction, and a first embedded layer within the first thin-film layer. The first embedded layer has a second index of refraction, and a ratio of the second index of refraction to the first index of refraction is greater than or equal to 1.5 and less than or equal to 3.0. The metalens may include a second thin-film layer having a third index of refraction and a second embedded layer having a fourth index of refraction. The second embedded layer may be within the second thin-film layer. The fourth index of refraction may have a ratio to the second index of refraction greater than or equal to 1.5 and less than or equal to 3.0. The metalens may include a third thin-film layer having a fifth index of refraction and a third embedded layer having a sixth index of refraction. The third embedded layer may be within the third thin-film layer. The sixth index of refraction may have a ratio to the fifth index of refraction greater than or equal to 1.5 and less than or equal to 3.0. A liquid-crystal embedded layer may be embedded in the third-thin film layer. The liquid-crystal embedded layer may have a first state and a second state, the first state having a sixth index of refraction and a ratio of the sixth index of refraction to the fifth index of refraction may be greater than or equal 1.5 and less than or equal 3. The second state of the liquid-crystal embedded layer may have a seventh index of refraction and a ratio of the seventh index of refraction to the fifth index of refraction being less than or equal to 1.5. The third thin-film layer may between the first thin-film layer and the second thin-film layer. A light path between the first thin-film layer and the second thin-film layer may be altered by the liquid-crystal embedded layer changing from the first state to the second state.

A metalens may transmit a predetermined range of wavelengths of light incident upon the metalens. The metalens may transmit light with a critical ray angle relative to a normal of the surface of the thin film of between 0 and 45 degrees, inclusive. A metalens may be disposed on an imaging pixel, between the imaging pixel and an imaging target. A metalens may be within an array of metalenses, each metalens disposed on an imaging pixel of an array of imaging pixels, the metalenses between the imaging pixel array and the imaging target. A metalens may have a field of view including an active area of an imaging pixel array and a circuit area of an imaging pixel array. A metalens may focus incident light on to the active area of the imaging pixel. The first embedded layer may fill a hole in the first thin-film layer. The hole in the first thin-film layer may have a ratio of depth of the hole to width of the hole between 1:1 and 1:10, inclusive. The first embedded layer may fill a plurality of holes in the first thin-film layer, the plurality of holes may have a lattice spacing of substantially half a predetermined target wavelength between each hole.

An example embodiment provides an optoelectrical device with a unit pixel having a metalens and an image sensor. The metalens may have a first thin-film layer having a first index of refraction, and a first embedded layer within the first thin-film layer. The first embedded layer has a second index of refraction and fills a first plurality of holes in the first thin-film layer. The first plurality of holes in the first thin-film layer may have a ratio of depth in the first thin-film layer to width of less than or equal to 1:20. The ratio of the second index of to the first index of refraction may be greater than or equal to 1.5 and less than or equal to 3.0. The ratio of the depth of the first plurality of holes in the first thin film layer to the width of the first plurality of holes in the first thin film layer may be between 1:3 and 1:6. The first plurality of holes may have a lattice spacing of substantially half a predetermined target wavelength between each hole. A metalens may transmit a predetermined range of wavelengths of light incident upon the metalens. The metalens may transmit light with a critical ray angle relative to a normal of the surface of the thin film of between 0 and 45 degrees, inclusive. The metalens may include a second thin-film layer having a third index of refraction and a second embedded layer having a fourth index of refraction. The second embedded layer may fill a second plurality of holes in the second thin-film layer. The metalens may include a third thin-film layer having a fifth index of refraction and a liquid-crystal embedded layer may fill a third plurality of holes in the third thin-film layer. The lattice spacing of the first plurality of holes, the second plurality of holes, and the third plurality of holes may be substantially equal to half a predetermined target wavelength. The liquid-crystal embedded layer may have a first state and a second state. The first state may have a sixth index of refraction and the first state may have a ratio of the sixth index of refraction to the fifth index of refraction being greater than or equal 1.5 and less than or equal 3, and the second state may have a seventh index of refraction and the second state may have a ratio of the seventh index of refraction to the fifth index of refraction being less than or equal to 1.5.

BRIEF DESCRIPTION OF THE DRAWING

In the following section, the aspects of the subject matter disclosed herein will be described with reference to exemplary embodiments illustrated in the figures, in which:

FIGS. 7A-7C depict example embodiments of placement of metalens according to the subject matter disclosed herein with respect to an image sensor with various chief ray angles;

FIGS. 8A-8C depict example embodiments of placement of microlens with respect to an image sensor with various chief ray angles;

DETAILED DESCRIPTION

Figure 1A:
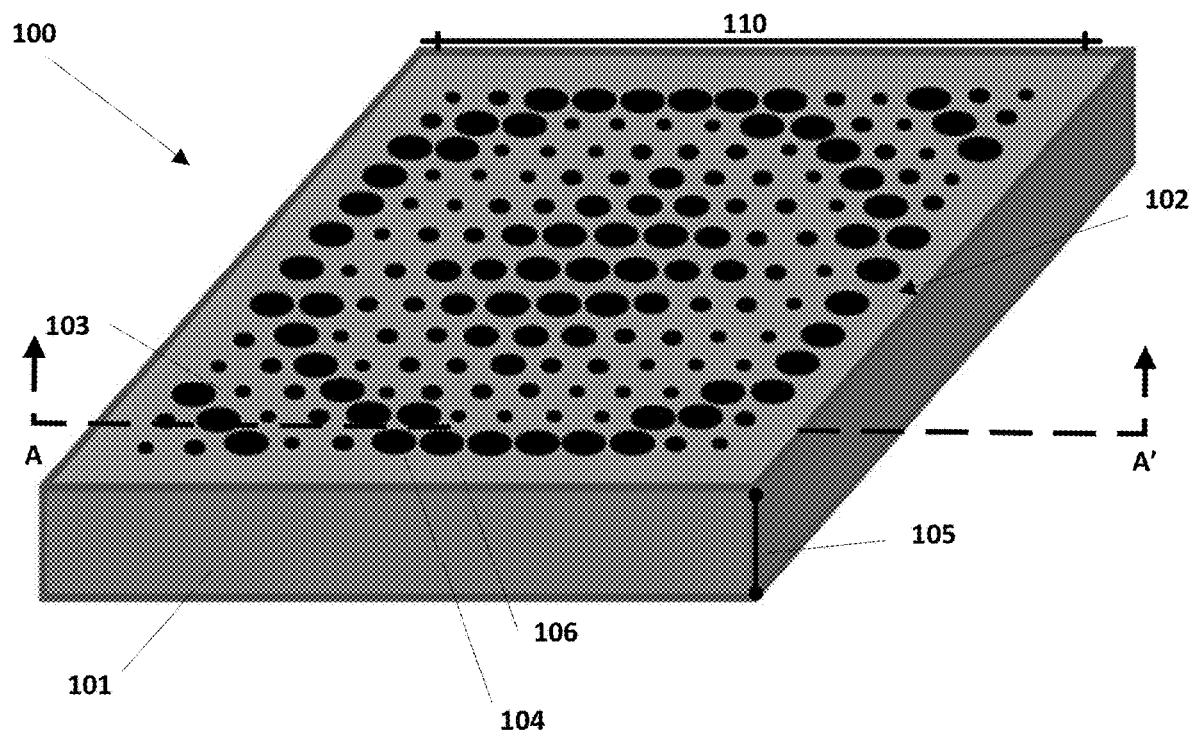
FIG. 1A depicts a perspective top plan view of an example embodiment of a metalens according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel operations may be advantageous. Moreover, the separation of various system components in the embodiments described above should not be understood as requiring such separation in all embodiments, and it should be understood that the described program components and systems can generally be integrated together in a single device or packaged into device.

As used herein, image sensors refer to a variety of devices using various mechanisms, material, and sizes to detect various forms of electromagnetic radiation. Furthermore, as used herein, light may refer to a broad spectrum of electromagnetic radiation from X-rays to Radio Waves, including ultraviolet, visible, near-infrared, mid-infrared, and far-infrared light. Additionally, while image sensors may be referred to singularly, image sensors may also be placed into arrays to capture more information than a single sensor. Still further, as used herein, light may be referred with respect to a target wavelength of the electromagnetic spectrum, however, the target wavelength may serve as a shorthand for a larger set of wavelengths forming a band of wavelengths, for example, the near-infrared region between 700 nanometers and 1200 nanometers.

Image sensors may be formed using various technologies, including producing the sensors on an integrated chip, or other form of substrate to produce an image sensor array. Individual image sensors within an image sensor array may also vary between each other in size, shape, layout, and target wavelength. As such, a single optical element, such as a lens, or a uniform array of optical elements, such as microlenses, may provide inconsistent benefits. For example, the radius of curvature optimal for an image sensor sensitive in the green region of the electromagnetic spectrum differs from the radius of curvature optimal for light in the UV or infrared regions of the electromagnetic spectrum, even when pixels are otherwise identical. Furthermore, differences to transmission/reflection/absorption of the materials used for optical elements will also vary along the electromagnetic spectrum. As such, integration with optical elements, such as lenses and microlenses, may be difficult with individual devices within an image sensor array.

As disclosed herein, thin films may be integrated into imaging sensors, such as photodiodes including single-photon avalanche diodes (SPAD) and avalanche photodiodes (APD). Such thin films may provide light modulation able to modulate the phase of light and provide improvements to the performance of the image sensors, such as increasing sensitivity, expanded application areas, more compact designs, better discrimination between wavelengths, increased field of view (FOV), and so forth. Thin films may provide such benefits when providing phase modulation of light transmitted, absorbed, or reflected by traversing the thin film. Such phase modulation may be used to create phase-modulating thin-film optics.

Phase-modulating thin-film optics may use metasurfaces to modify the phase of light. Such modifications may reduce aberrations, improve efficiency, alter the polarization of light, and change the field of view, among other benefits. Such phase-modulating thin-film optics may allow for optimization of an image sensor array at the individual sensor level, optimizing the light for a specific location or predetermined target wavelength.

Metamaterials are materials composed of multiple elements arrayed in patterns normally not found in nature. These patterns are typically of materials at the nanoscale or microscale, and often form a repeating pattern. Such patterns may also comprise a series of patterns, which may or may not repeat. The shape, geometry, size, orientation, and arrangement of the materials may produce a number of effects, especially on the surface of a thin film, also known as a metasurface. A metamaterial pattern may use elements and patterns having a size that varies from multiple microns to a fraction of a target wavelength. As used herein, metamaterial and metasurfaces may be used interchangeably.

A metasurface thin film thus may use nanoscale and microscale elements to alter electromagnetic waves traveling through the thin film. By careful choice of patterns, a metasurface may create within the thin film layer local conditions within the thin film that alters the index of refraction, and thus alter the magnitude of interaction with light through the thin film. By doing so, phases of light passing through the thin film may be modulated. Due to some of the metasurface elements being subwavelength, the metasurface elements may produce changes at a much smaller size than conventional optics. Additionally, although refractive index is used herein, the refractive index changes here are related to the differences in the dielectric constant. As such a high-index material will have a higher dielectric constant while a low-index material with have a lower dielectric constant.

Disclosed herein are differing techniques to create metasurface lenses, or metalenses using holes within a thin film to create a phase-modulating thin-film. A hole-based metalens array may use an array of nano-micro holes arranged within a surface of a thin film to provide a metasurface. The hole-based approach may use various techniques, such as etching including wet chemical etching or dry plasma etching, to pattern a thin film surface to create a series of holes. The holes are shaped such that each hole acts as an element of the metasurface, altering the phase of target wavelength light traveling through the thin film. The holes may be left empty, or in some embodiments may be filled. In some embodiments, the thin-film layer bulk region may include a high-index material, and the holes may be filled with a low-index material. In some embodiments, the thin-film bulk region may include a low-index material, and the holes may be filled with a high-index material. In further embodiments, the thin film may be filled with a liquid-crystal material having an adjustable refractive index, for example, when presented with an electric charge.

Additionally, the techniques disclosed herein may produce a number of differing effects depending on the desired changes for light traveling through a thin film layer. For example, in some embodiments, the metasurface may be optimized to minimize jitter time, shift chief ray angles, adjust a fill factor, re-direct light towards a given pixel, and combinations thereof. Metasurfaces may control the phase of light, and thus controls aberrations, efficiency, polarizations, field of view (FOV), etc. Metasurfaces may control the phase of light over a full $2\pi$, and may modify the phase of light incident on the entire surface, or only selective portions of a surface, or may modify the phase of light incident across the surface differently across the surface. Metasurfaces may also allow optimization of each pixel, i.e., different wavelengths may be optimized individually, as well as optimization for the position of the pixel for features such as focus and field of view. For example, in some embodiments, a metasurface may shift light that would be impinging on an electronics readout area to focus on a pixel on the edge of an image sensor, thereby reducing noise from stray current induced in the electronics while increasing the strength signal on an imaging pixel. Furthermore, metasurfaces may be made compact. For example, a metalens for an image sensor may have a comparable area to each sensor element, while the metalens may be only a few nanometers thick. As such, metalenses allow for optical modifications of light within an integrated device, such as an integrated chip. Additionally, the metalens may vary the phase profile of the light in all or only part of the lens, for example, adjusting the phase of light around the edges of a pixel while light incident the center is unchanged. Alternatively, a metalens my cover only a portion of a surface where phase modifications are needed, and leave the rest uncovered.

Furthermore, metalenses may be created directly in thin films. As such, metalens production is compatible with various forms of semiconductor processing techniques, such as the techniques used in CMOS devices. Such techniques allow the creation of a metalens at various stages and in various layers within an image sensor. For example, metasurfaces may be produced in a number of different thin-film layers that may overlay an image sensor, and thus may produce metalenses in, for example, passivation layers and/or anti-reflection layers. Alternatively, metasurfaces may be produced in layers below the image sensor or even the backside of a substrate when the image sensor is reverse mounted. Metasurfaces and metalenses may be created on a single substrate on a top side of an image sensor, on a back side of a substrate or metasurfaces may be created on both the top and back side surfaces of a substrate for use as metalenses. Additionally, in some embodiments, the metasurfaces may be created on a different substrate and transferred to the image-sensor substrate.

Such metasurfaces and metalens may use a variety of materials, including various forms of silicon and materials containing silicon, such as polycrystalline silicon, crystal silicon, silicon nitride, silicon oxide, and silicon carbide, as well as any other material transparent to the target wavelength sensors, such as transparent metals like indium tin oxide (ITO), as well as polymer layers.

Furthermore, because metalenses may be created in thin film-manufacturing processes, and require a relatively small size, multiple metalens arrays may be produced within a single device. The additional metalenses may be produced in different areas of the image sensor, for example, creating separate patterns for different wavelength sensors, such as different metalens arrays for red, green, and blue image sensors, or may create an array of sub-patterns, for example, an array of metalens patterns with sub-patterns for red, green, and blue image sensors in the subpixels of an imaging device. Alternatively, the metalenses patterns may differ across the array to alter the field of view to provide a wider field of view at a side, and a narrower field of view towards the center. Furthermore, the metalenses may be used to create a binary grating, or series of binary gratings. The additional metalenses may be produced as well in different thin-film layers, and may overlap, in full or in part, metalenses in lower layers. As such, the differing layers of metalenses may be optimized to produce different effects or may be optimized to work in combination other layers of metalenses to produce a stronger effect than a single layer. As a result, a metalens device may produce multiple layers of lenses in a device more compact than a single array of microlenses.

Additionally, while the present disclosure focuses on image sensor applications, such metalenses as described herein may be used in a variety of applications where electromagnetic radiation is transmitted or received. For example, the metalenses may be used in other forms of optical sensing which do not generate an image, such as sensor used to detect the presence and/or intensity of specific portion of the electromagnetic spectrum, such as a thermal sensor for detecting infrared radiation, or a UV exposure device. Furthermore, a metalens may be used in some embodiments for non-sensing applications, such as solar cells, where metalenses may allow a greater field of view and increased the efficiency of the solar cells, who are able to process additional light. Still further, a metalens may be used in some embodiments to adjust the properties of light being emitted from a device, for example, a metalens may be used to provide expanded viewing angles for a light emitting pixel, such as a light-emitting diode (LED), organic light-emitting diode (OLED), plasma, or other form of emissive pixels. Such a metalens may be used within a display device with a backlight, such as liquid-crystal displays (LCDs). Furthermore, the phase modifying aspects of the metalenses may be used for display related features such as filtering light in a narrowband or wideband, enhancing the emission of light in a particular direction or orientation, correction of images for features such as blur and aberrations, and altering the phase of emitted light. The phases of light transmitted through a metalenses may be phase shifted over a full period of $2\pi$. Additionally, metalenses may be used in combination with features such as parallax barriers to produce stereoscopic or multiscopic imagery.

Figure 1B:
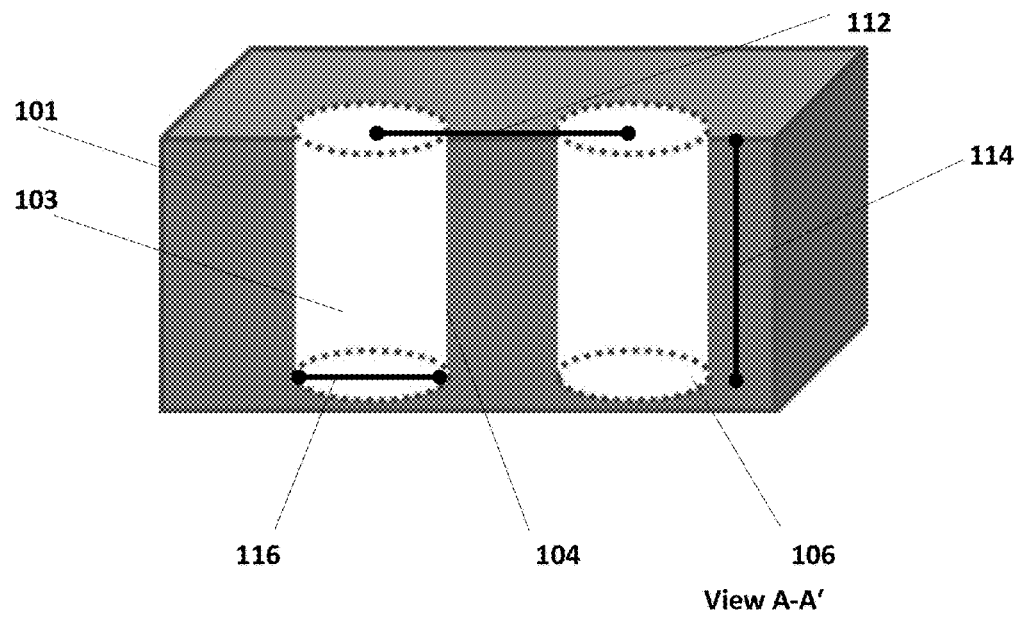
FIG. 1B depicts a cross-section view of a portion of an example embodiment of a metalens according to the subject matter disclosed herein.

FIG. 1A depicts an exemplary embodiment of a metasurface forming a metalens 100 according to the subject matter disclosed herein. The metalens 100 is formed of a pattern 102 of individual metasurface elements, including a first metalens element 104 and a second metalens element 106. FIG. 1B depicts a portion of a cross-sectional view taken along line A-A'A' of the first metalens element 104 and the second metalens element 106. The metalens 100 may contain multiple materials, including a first bulk material 101 forming the bulk of the metalens structure, and a second material 103 forming the metalens elements. In some embodiments, the metalens elements may be formed of multiple differing materials. Furthermore, the metalens 100 may be optimized by, for example, varying a pattern 102 of the array of metalens elements, as well as a size 110 of the pattern 102, a lattice spacing 112 between individual metalens elements, a height 114 of the individual metalens elements, and/or a width 116 of the individual metalens elements. Note, while some illustrated embodiments may show the height 114 of the individual metalens elements as equal to the thickness 105 of the thin-film layer forming the bulk of the metalens, the height 114 of the individual metalenses elements may differ from the thickness 105 of the thin-film layer, and thus not fully penetrate the thin-film layer. In some embodiments, the height 114 of the individual metalens elements may be related to the width 116 such that an aspect ratio of width 116 to height 114 of each element may be between about 1:1 and about 1:20, or may between about 1:3 and about 1:6.

The first bulk material 101 may be a material with a high index of refraction with respect to target wavelengths of the metalens, while the second material 103 may be a material with low index of refraction with respect to the target wavelengths of the metalens. Alternatively, the first bulk material 101 may be a material with a low index of refraction with respect to the target wavelengths of the metalens, while the second material 103 may be a material with a high index of refraction with respect to the target wavelengths of the metalens. In some embodiments, the second material 103 may be left open so that air forms the low-index material, such that the metalens elements are holes within the first bulk material 101. In further embodiments, liquid-crystal materials may be used for either the first bulk material 101 or the second material 103 with the liquid crystal being switchable between a high index of refraction and a low index of refraction. Alternatively, the liquid crystal may be switchable between polarization states. In further embodiments, the liquid-crystal materials may be used with a high-index material or a low-index material. As used herein, high index of refraction and low index of refraction are used in a relative term towards each other. For example, in some embodiments, a high index of refraction may be 1.5 or higher while a low index of refraction may be 1.5 or less. In some embodiments, a ratio between the high-index material and the low-index material may between 1.5 and 3. Such a difference in index of refraction may be used along with other variables to control the phase changes of electromagnetic radiation through such a metalens.

In an example embodiment in which the first bulk material 101 is a material with a low index of refraction and the second material 103 is a material with a high index of refraction, the combination may produce an effect similar to creating an array of nanopillars. As such, specifics for the pattern 102 of the array of metalens elements, as well as the size 110 of the pattern 102, the lattice spacing 112 between individual metalens elements, the height 114 of the individual metalens elements and the width 116 of the individual metalens elements may be similar to a nanopillar array to produce the desired optical effect on a target wavelength.

In an example embodiment in which the first bulk material 101 is a material with a high index of refraction and the second material 103 is a material with a low index of refraction, the combination may produce an effect similar to creating an array of holes within thin layer. However, the use of a second material 103 allows for a controlled index of refraction rather than relying on holes, which on a surface layer has the index of refraction reflect the atmospheric conditions of the lens, while on a subsurface layer may have the holes either filled by the material of another layer or may produce voids having shapes and conditions that are inconsistent.

Furthermore, while FIG. 1A and FIG. 1B depict the first metalens element 104 and the second metalens element 106 having a cylindrical shape, the shape of the metalens elements may vary. For example, metalens shapes may include prims with polygonal cross-sections including rectangular prisms, cubes, etc.; as well as shapes featuring various forms of conic section cross-sections, and other shapes such as arrows, stars, etc. Furthermore, while the first metalens element 104 and the second metalens element 106 are depicted having the same shape, the individual metalens elements may include multiple shapes with multiple widths and depths in a shared pattern.

Figure 2:
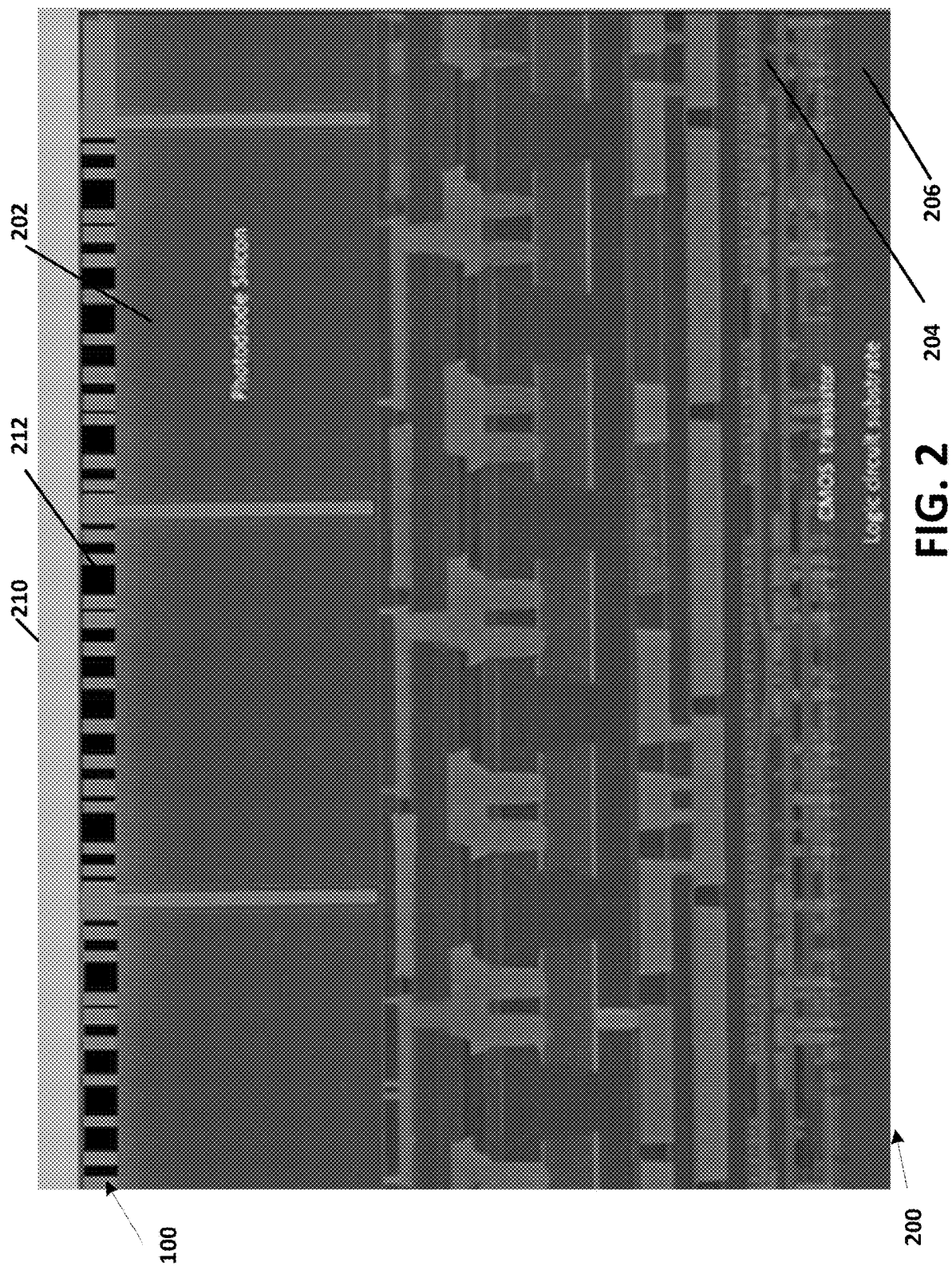
FIG. 2 depicts a cross-section view of an example embodiment of an image sensor using a metalens according to the subject matter disclosed herein.

FIG. 2 depicts an example embodiment of a metalens integrated into an image sensor 200 according to the subject matter disclosed herein. The metalens may take the form of the metalens 100, with FIG. 2 depicting a cross section of the metalens 100 and image sensor together. In FIG. 2, the metalens 100 is formed in a passivation layer 212 on top of photodiode sensors 202 formed in a layer of silicon. In this example embodiment, an anti-reflection layer 210 is on top of the passivation layer 212, although in other embodiments, the metalens 100 may be formed in the anti-reflection layer 210 or multiple metalenses may be formed, with one in the passivation layer 212, and another in the anti-reflection layer 210. The photodiode sensors 202 may be located on top of a series of layers forming CMOS transistors 204, which in turn may be located on a logic circuit substate 206. The substrate may be any suitable known in the art, for example, a silicon wafer or a silicon-on-insulator substrate such as glass.

The metalens 100 may be made in the passivation layer 212 or anti-reflection layer 210 during the production of the image sensor 200 by etching the passivation layer 212, which may be the first bulk material 101 of the metalens 100 and depositing the second material 103 after the bulk deposition of the thin-film layers are performed.

Figure 3:
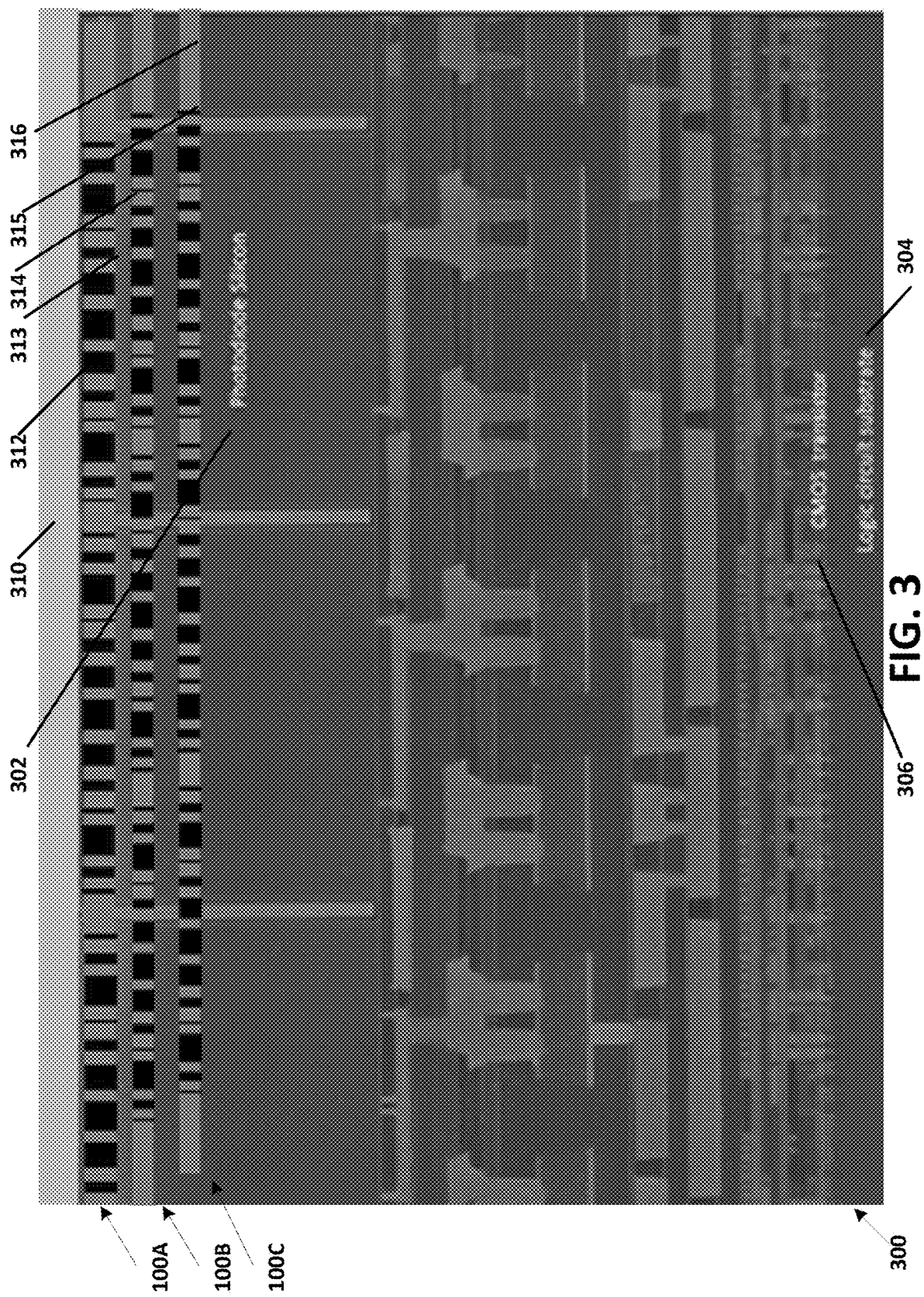
FIG. 3 depicts a cross-section view of an example embodiment of an image sensor using a multi-layer metalens according to the subject matter disclosed herein.

FIG. 3 depicts an example embodiment of multiple metalenses integrated into an image sensor 300. The metalenses may take the form of multiple metalenses with FIG. 3 depicting a cross section of the metalens and image sensor together. In FIG. 3, three metalenses are formed on top of photodiode sensors 302, that are formed in a first metalens 100A, a second metalens 100B and a third metalens 100C. The photodiode sensors 302 may be located on top of a series of layers forming the CMOS transistors 304, which in turn may be located on the logic circuit substate 306. The first metalens 100A may be formed in first layer 312, the second metalens 100B may be formed in a second layer 314, and the third metalens 100C may be formed in a third layer 316. A passivation layer may be one or more of the first layer 312, the second layer 314 and the third layer 316. In this example, an anti-reflection layer 310 may be on top of the passivation layer, although in other embodiments, the three metalenses (or more) may be formed in the anti-reflection layer 310 or multiple metalenses may be formed, with at least one in the passivation layer, and at least one in the anti-reflection layer 310. The first layer 312 and the second layer 314 may be in contact directly or have a first spacer layer 313 between the first layer 312 and the second layer 314. The second layer 314 and the third layer 316 may be in contact directly or have a second spacer layer 315 between the second layer 314 and the third layer 316. Additionally, a third spacer layer may be between the third layer 316 and the photodiode sensors 302. The spacer layers may include an optically transparent layer for the target wavelength. In some embodiments, the spacer layers may be formed of a low-index material suitable for use as a first bulk material 101, while in other embodiments, the spacer layers may be formed of a high-index material suitable for use as a second material 103 for use as a nanopillar element. In some embodiments, the spacer layers may be created during the formation of an adjacent bulk layer or second material layer. In some embodiments, the spacer layers may include a transparent metal, such as Indium Tin Oxide (ITO) patterned to match one or more of the metalenses.

The first metalens 100A in the first layer 312 may be identical to the second metalens 100B in the second layer 314, and/or the third metalens 100C in the third layer 316. Alternatively, each of the three metalens may vary in at least one of the patterns 102 of the array of metalens elements, as well as the size 110 of the pattern 102, and/or the lattice spacing 112 between individual metalens elements. Furthermore, each of the three metalens may vary in at least one of the the height 114 of the individual metalens elements, the width 116 of the individual metalens elements, the shape of the individual metalenses, and/or the thickness of the layer the metalens is formed in. Furthermore, each metalens may differ in the first bulk material 101 and the second material 103. The layers may each be optimized for different target wavelengths or may be optimized to produce different effects on the same target wavelengths. For example, the first layer 312 may be optimized to filter wavelengths by shifting the field of view towards individual photodiode sensors, while the second layer 314 may be optimized to focus a specific predetermined target wavelength to a specific photodiode sensor at a specific depth, and the third layer 316 may be optimized to minimize the jitter time produced by a photodiode sensor.

Furthermore, in some embodiments, one or more of the first layer 312, the second layer 314, and the third layer 316 may contain a liquid-crystal material in the metalens elements. In some embodiments, the first spacer layer 313 and the second spacer layer 315 may form addressing lines to activate the liquid-crystal material and change the liquid-crystal material between a first index of refraction and a second index of refraction. Alternatively, the liquid-crystal material may switch between polarization states upon activation. A liquid-crystal metalens may be used in combination with polarizers above or below the metalens layers, or may be used in combination with additional metalenses that are polarization sensitive. In some embodiments, a liquid-crystal metalens may act as a gate between different optical paths, while in some embodiments, a liquid-crystal metalens may switch between optimization states. The liquid-crystal metalens may also act to shift the FOV of individual image sensors to different metalens structures for the same target wavelength with different conditions. For example, a liquid-crystal metalens element may switch the path of light between a metalens optimized for focusing light in a near field to a metalens optimized for focusing light in a far field. Other switching situations may switch the polarization of light to determine the polarization of light, or may switch between a metalens optimized for transmission and a metalens optimized for phase shift, etc. The liquid-crystal material may also be activated by additional addressing layers not shown in FIG. 3, either above or below the metalens layers. In some embodiments, the liquid-crystal material may also be used in a passive structure, for example, with the liquid-crystal material being sensitive to various factors, such as temperature to change its alignment based on ambient conditions.

Additionally, FIG. 3. Depicts each of the first layer 312, the second layer 314, and the third layer 316 as vertically overlapping. However, the metalenses of each layer may, in some embodiments, overlap each other only partially or not at all. For example, the first metalens 100A, the second metalens 100B and the third metalens 100C of each of the first layer 312, the second layer 314, and the third layer 316 may have a different target wavelength that an image sensor array detects in different portions of the array. As such, the first metalens 100A in the first layer 312 may be formed over only a first target wavelength region, the second metalens 100B in the second layer 314 may be formed only over a second target wavelength region, and the third metalens 100C in the third layer 316 may be formed only over a third target wavelength region. For example, this may produce separate metalens arrays to focus on each of a red, green, and blue sensitive photodiodes.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

Figure 4:
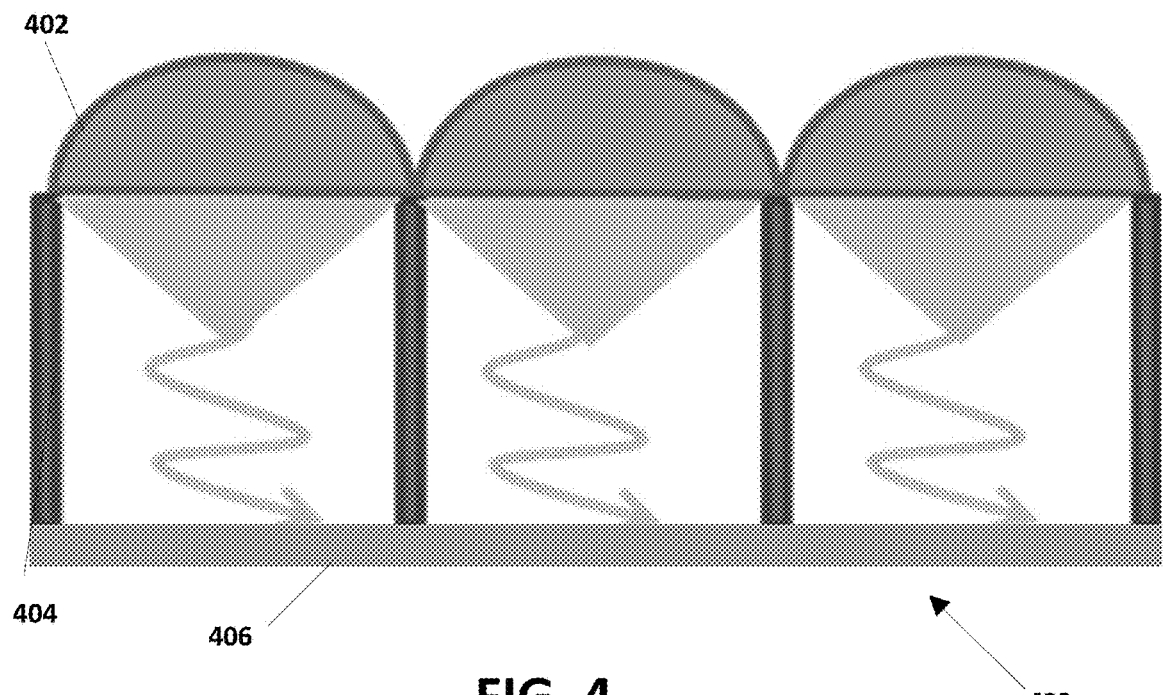
FIG. 4 depicts an example embodiment of a traditional image sensor using microlenses.
Figure 5:
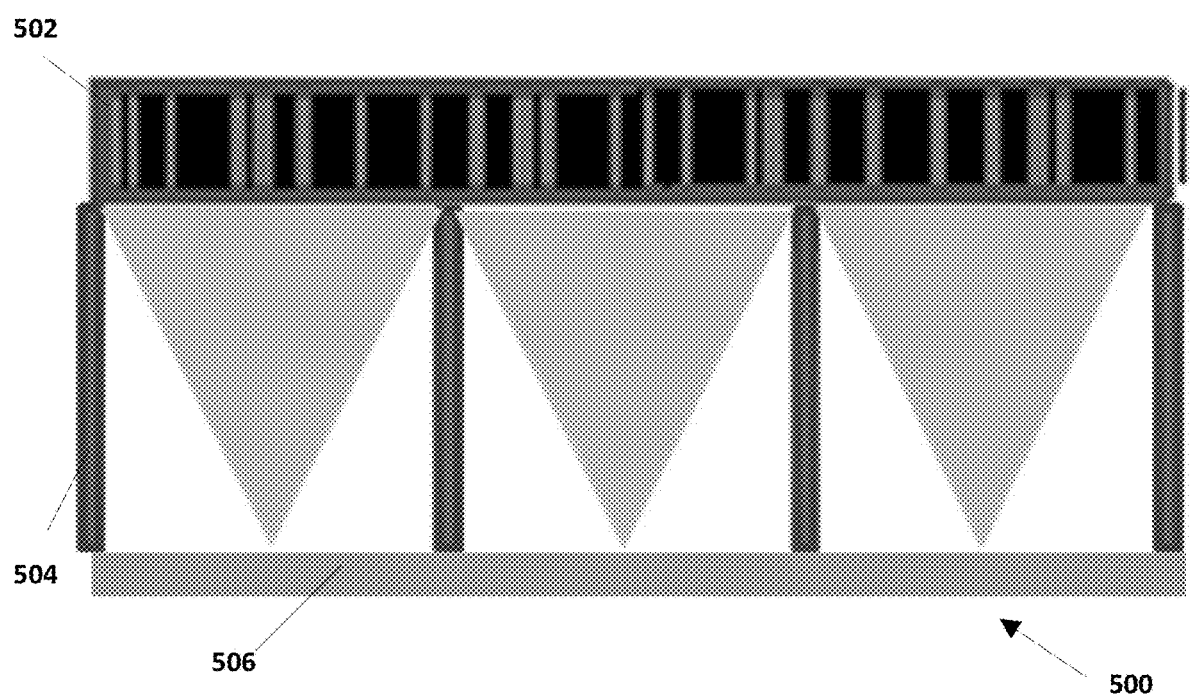
FIG. 5 depicts an example embodiment of an image sensor using a metalens according to the subject matter disclosed herein.

FIG. 4 and FIG. 5 respectively depict example embodiments of a traditional microlens array device 400 and a metalens array device 500 according to the subject matter disclosed herein. The traditional microlens array device 400 includes a set of traditional microlenses 402 arranged over image sensors 406. Each individual image sensor 406 is spaced apart by a deep trench isolation (DTI) column 404. The DTI columns 404 may contain a reflective material, such as a metal or highly doped silicon, to reflect stray light. However, as traditional microlenses may be optimized for a broadband set of wavelengths, an individual target wavelength may have its focus only part way between the traditional microlenses 402 and the image sensors 406. The light may have a long pathway as it reflects off the columns DTI 404. A long path length may cause an increase in jitter time, as light takes longer to reach the image sensors and thus longer for a change in lighting conditions to produce a measurable change in signal.

In contrast, the metalens array device 500 may use a metalens array 502 optimized for the target wavelengths of the image sensors 506, such that light traveling between the metalens array 502 and the image sensors 506 travels a direct path towards the image sensors 506 by focusing on the image sensors themselves and thus requires less time to detect a change in the light conditions. Such an effect may be pronounced in image sensors using SPAD or APD sensor elements, as SPAD and APD sensor elements may use large pixel sizes that thus reduces the amount of curvature practical for a microlens element. Additionally, a deep trench isolation (DTI) column 504 may not require a reflective material in some embodiments, potentially simplifying production. Furthermore, reduction of the jitter time affects the required thickness of a photosensor as a more direct and focused light requires less depth to be sensed. Additionally, the pattern of each metalens of the metalens array 502 may be optimized for each individual sensor, for example, to optimize the capture of the target wavelengths by the image sensor, or to shift the field of view depending on the position of the sensor element.

Figure 6A:
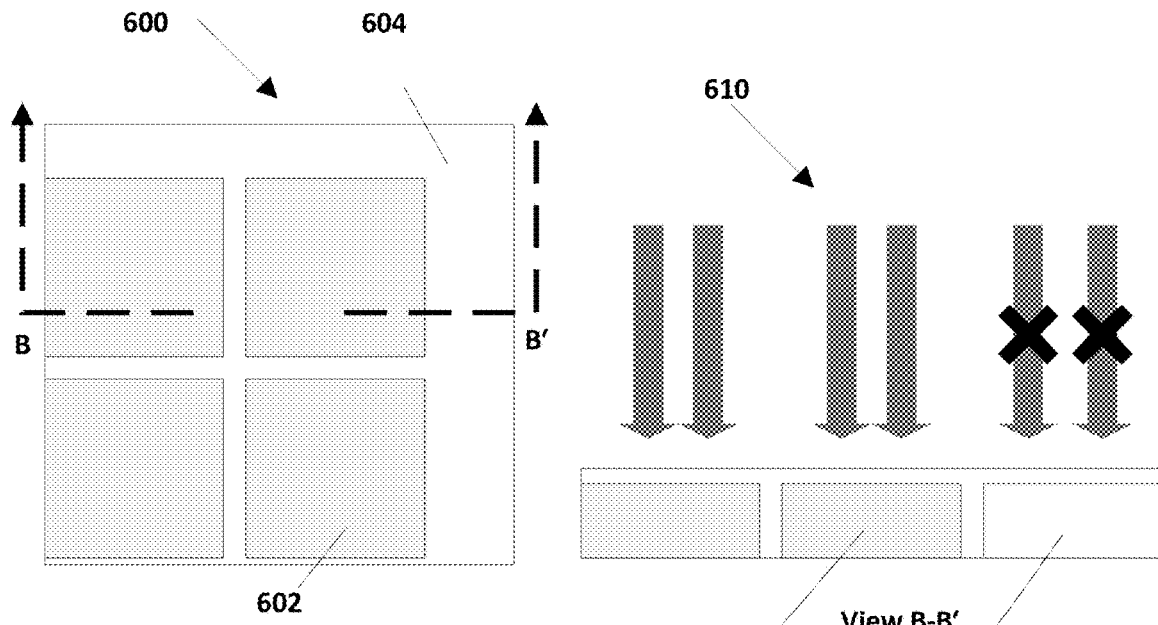
FIG. 6A depicts an example embodiment of a top plan view and a cross-section of an image sensor without a metalens.
Figure 6B:
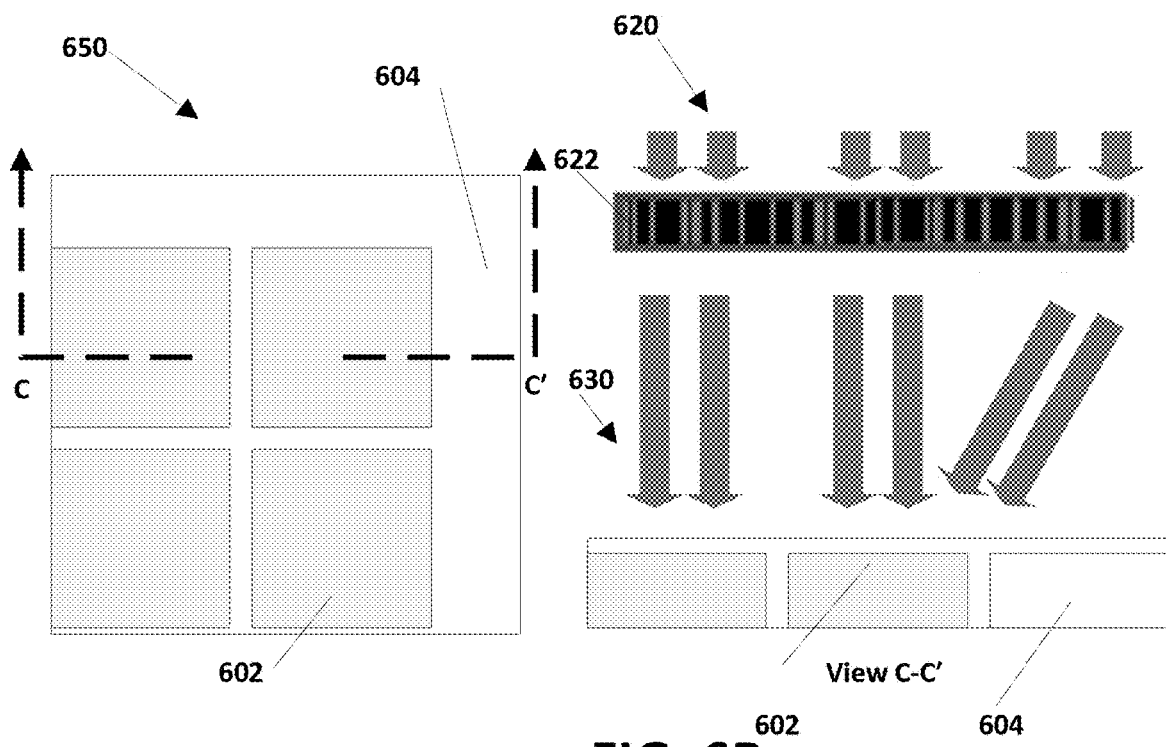
FIG. 6B depicts an example embodiment of a top plan view and a cross-section of an image sensor with a metalens according to the subject matter disclosed herein.

FIG. 6A and FIG. 6B respectively depict a representation of an image sensor layout for a first device 600 and a second device 650 incorporating a field of view shifting metalens 622 according to the subject matter disclosed herein. In each of FIGS. 6A and 6B, the image sensor is shown on the left by a layout view and on the right by a cross section across the marked region of the layout view. The image sensor has sensor elements 602 forming an array across the first device 600, with an electronics region 604 surrounding the image sensor array. The first device 600 depicts a device without a metalens, in which light 610 is incident on the first device 600. In the sensor elements 602, the light 610 may be sensed when incident the individual sensor elements. Light over the electronics region 604 is not directly sensed. Often the electronics region may be masked or shielded to prevent light from being incident the electronics region 604 and generating noise and stray currents. The second device 650 incorporates a field of view shifting metalens 622. Light 620 being incident on the field of view shifting metalens 622 may travel directly as light 630 towards the sensor elements 602 over that portion of the second device 650. However, the field of view shifting metalens 622 may shift the light 620 being incident on the field of view shifting metalens 622 above the electronics region 604 towards the sensor elements 602. Such a shift provides the edge sensor elements 602 with additional light and thus a stronger signal. The shift may also reduce the light on the electronics region 604, thereby reducing the noise on the device, and may be used with or without masking on the electronics region 604. As such a stronger signal-to-noise ratio may be obtained. Furthermore, the increased capture area improves the fill factor by increasing the amount of light being incident upon the device that may be used.

FIG. 7A-7C and FIG. 8A-8B respectively depict the effect of a metalens 100 with respect to various chief ray angles (CRA) in comparison to a lenslet used in a microlens array according to the subject matter disclosed herein. FIG. 7A depicts a first ray 700 at approximately normal to the imaging pixel 704. A first metalens 702 may direct the light towards the imaging pixel 704 without a shift to the field of view. FIG. 7B depicts a second ray 710 at a slight angle of approximately 15 degrees from normal in which a second metalens 706 may use phase shifting properties of the elements of the second metalens 706 to re-direct the light towards the imaging pixel 704. FIG. 7C depicts a third ray 720 at a larger angle of approximately 45 degrees from normal in which a third metalens 708 may use phase shifting properties of the elements of the third metalens 708 to re-direct the light towards the imaging pixel 704. The first metalens 702, the second metalens 706 and the third metalens 708 may share the same pattern and layout of elements with the elements optimized for a wide field of view. Alternatively, the first metalens 702, the second metalens 706 and the third metalens 708 may be each optimized for a different field of view. For example, any of the first metalens 702, the second metalens 706 and the third metalens 708 may be the metalens field of view shifting metalens 622. Furthermore, the metalenses may be used together or in combination with additional metalenses to focus the redirected light at a specific depth within the imaging pixel 704. In further embodiments, additional metalenses may be used to provide filtering or other forms of phase modifications.

In contrast, FIG. 8A-8C depict a microlens-based approach to adjusting the chief ray angle by adjusting the offset of an individual lenslet. FIG. 8A depicts a lenslet 802 is mounted directly over the photosensor 808 and focuses light from a first ray 812 normal to the layout 810. The light has a focal spot between a first metal trace 804 and a second metal trace 806 that act as apertures for the image sensor. FIG. 8B depicts a layout 820 in which the lenslet 802 is offset from the photosensor 808 to adjust the chief ray angle of the photosensor 808 to accept a second ray 822 about 13 degrees off normal. The focus shifts slightly towards the edges of the aperture, risking some of the light being cut off at more extreme angles. FIG. 8C depicts a layout 830 for an additional offset of the lenslet 802 from the photosensor 808 to adjust the chief ray angle of the photosensor 808 to accept a third ray 832 at about 25 degrees off normal. The shift in FIG. 8C makes clear that a portion of the light on the image sensor now misses the device entirely, as the portions of the lens extend beyond the width of the photosensor 808 and into adjacent pixels. Light accumulated at the extreme edges of the lenslet 802 may be directed into another pixel, while other portions of the sensor may lack a lens to capture light which is now directly being incident the first metal trace 804 and the second metal trace 806.

Figure 9:
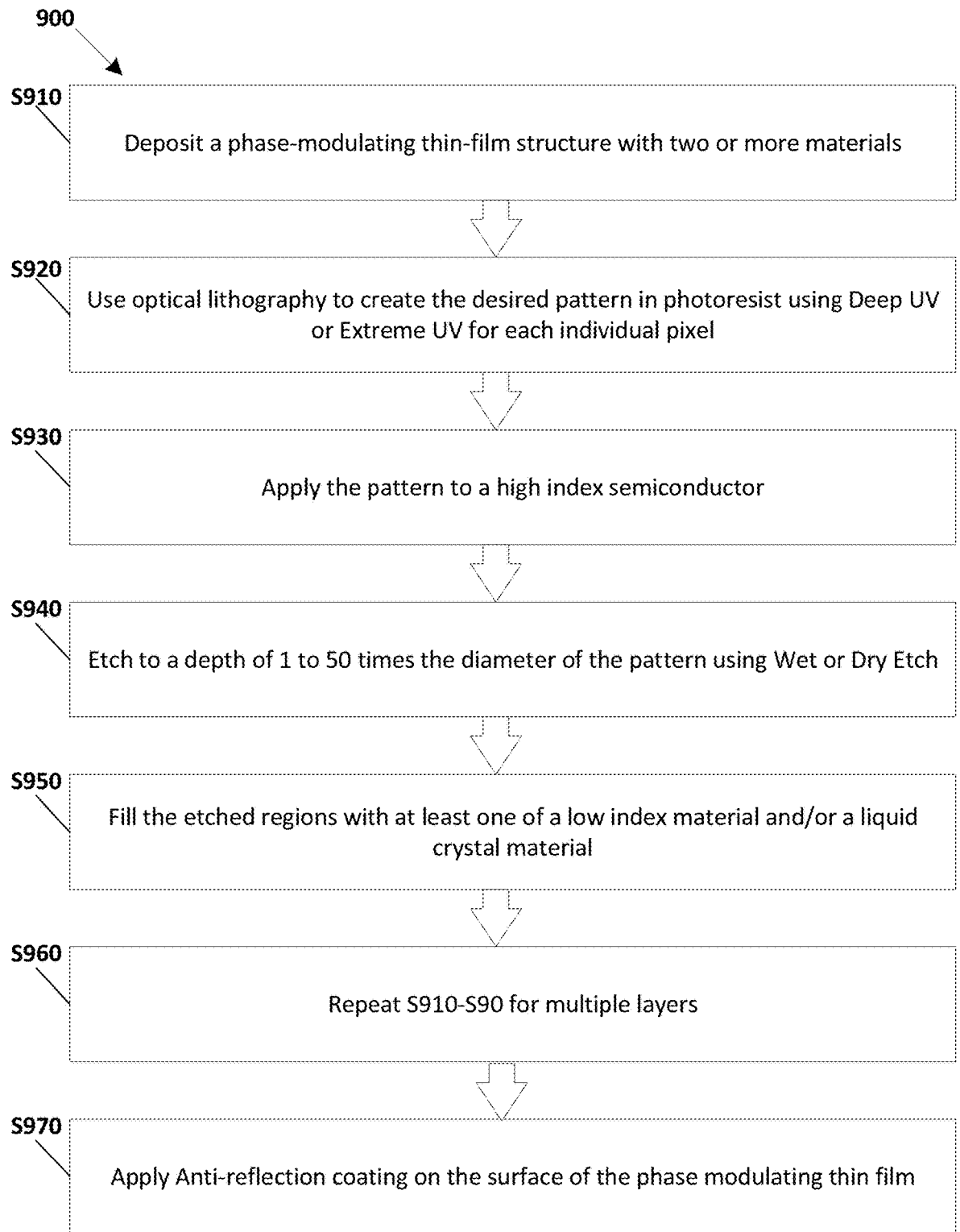
FIG. 9 depicts a flow chart of an example embodiment of a method of forming a metalens according to various embodiments of the subject matter disclosed herein.

FIG. 9 depicts a flowchart of an example embodiment of a method 900 to create a metalens as disclosed herein. At S910, a phase-modulating thin-film may have a surface or structure formed with two or more different materials. For example, the thin film may be made of silicon nitride or silicon oxide. At S920, optical lithography may use deep or extreme UV to pattern a photoresist layer to form a desired array of nanostructures for each individual pixel. At S930, the pattern may be transferred to a high-index semiconductor for etching. At S940, the pattern is etched using either dry or wet etch, the pattern being etched to a depth between 1 and 50 times the diameter of the pattern. At S950, the etched area may be filled with a secondary material, such as a low-index material or a liquid-crystal material. At S960, the process of S910-S950 may be repeated to create multiple layers, and/or multiple metalenses. At S970 an antireflection coating may be built on top of the phase-modulating thin-film. The anti-reflection coating may be made of one or more layers of two or more materials, such as silicon oxide or silicon nitride.

Figure 10:
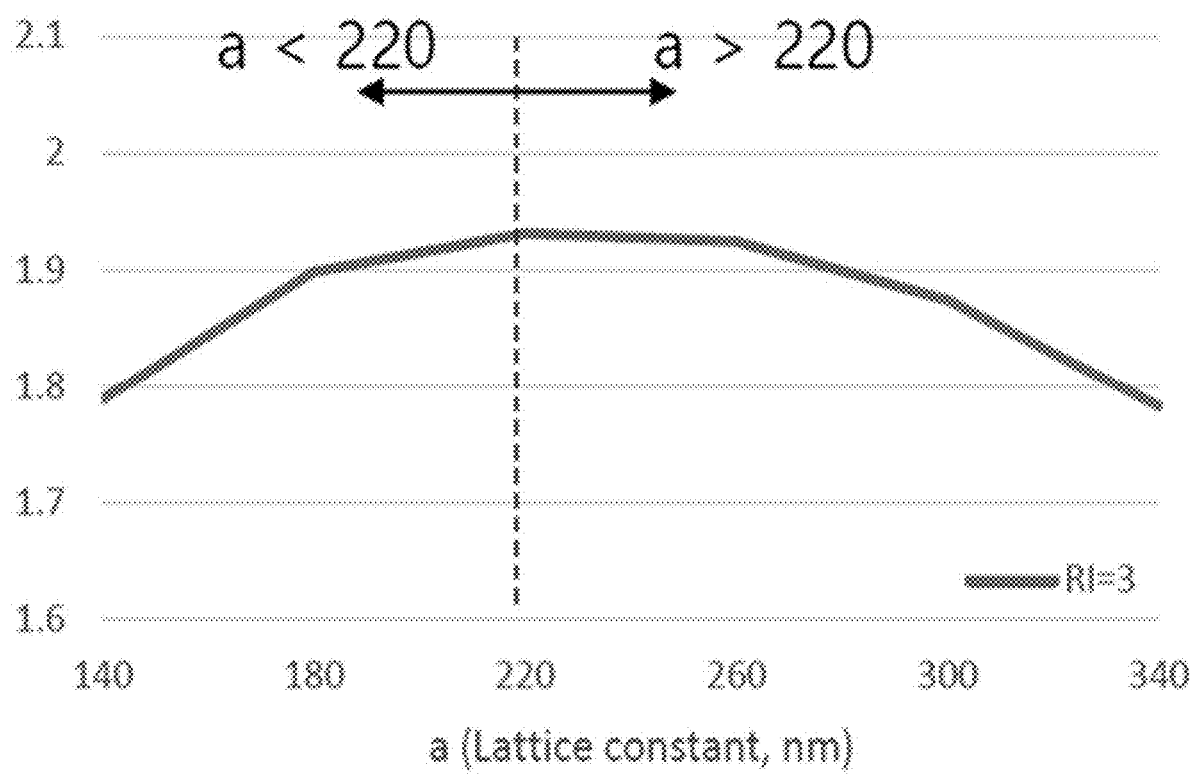
FIG. 10 depicts a comparison of phase shift to lattice constant according to various embodiments of the subject matter disclosed herein.

FIG. 10 is a graph depicting the effect of varying the lattice spacing on the phase shift of a microlens. As per the graph 1000, the lattice constant a (also referred to as the lattice spacing 112) is varied for a given microlens with a distance of between 140 and 340 nanometers. For this example, the phase shift was found to peak at around 1.92 π for a lattice constant of 220 nm. At a lattice spacing of below 220 nm, the phase shift decreases with the lattice spacing as the range of viable hole sizes decreases. In the embodiment of FIG. 10, the hole sizes varied between a diameter of 30 nm, to a diameter of a-15 nm to keep an aspect ratio of hole depth to width to remain lower than 1:20. At a lattice spacing of above 220 nm, the phase shift decreases with lattice spacing, as the cell size becomes more comparable to the target wavelengths.

Figure 11A:
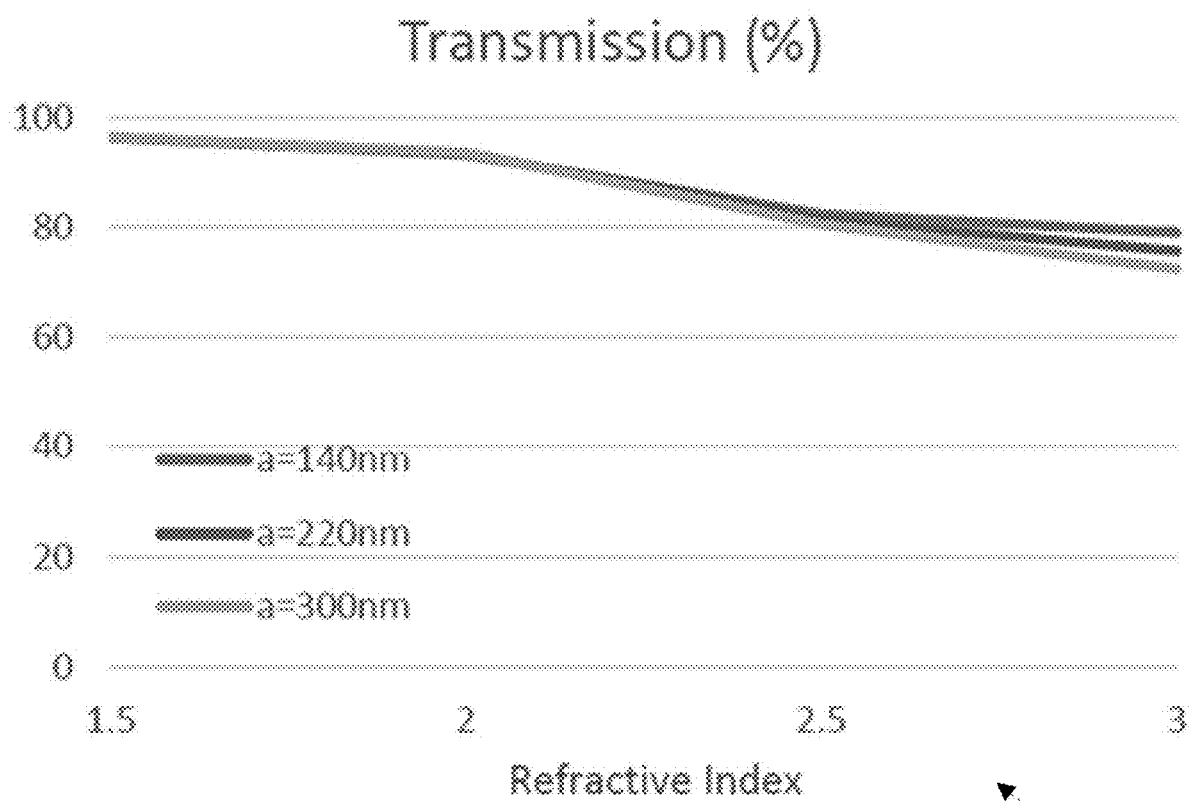
FIGS. 11A and 11B depict the reflective index versus the transmission and phase shift at various lattice spacings according to various embodiments of the subject matter disclosed herein.
Figure 11B:
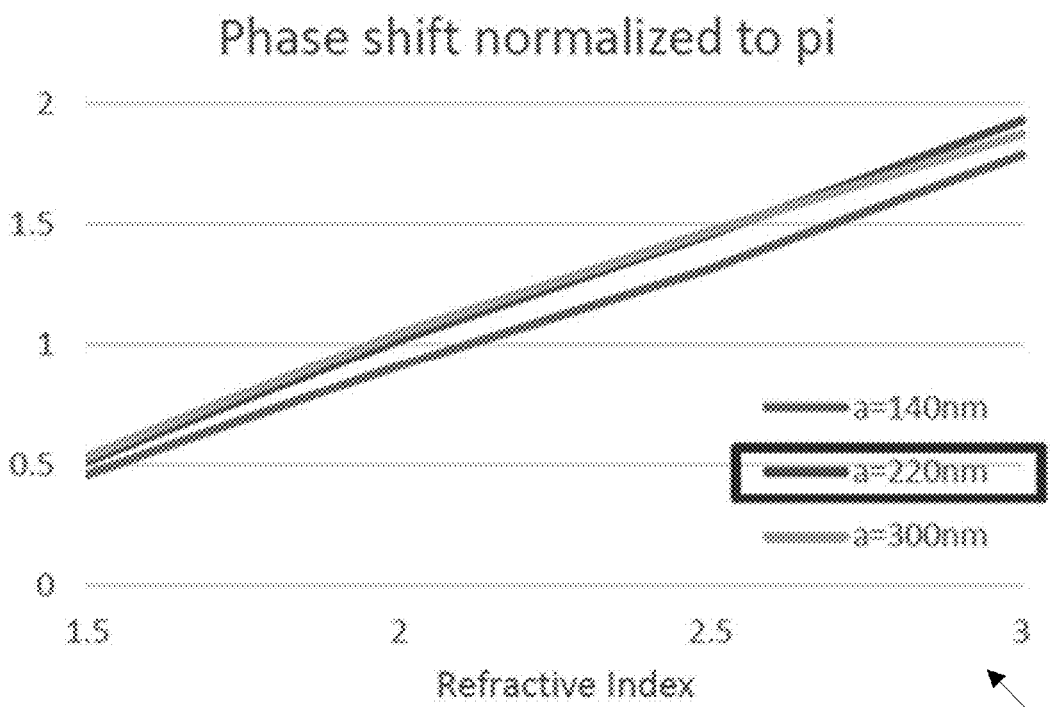

FIG. 11A and FIG. 11B respectively, are graphs respectfully depicting the effect of the refractive index of the second material 103 versus the transmission and the normalized phase shift of an example embodiment according to the subject matter as disclosed herein. In the example embodiment for FIGS. 11A and 11B, the thin film layer used was Silicon Dioxide ($SiO_2$) with a refractive index of 1.5 and a layer thickness of 600 nm and a target wavelength of 800 nm. The transmission depicted in FIG. 11A by graph 1100 demonstrates a relative transmission for lattice spacings of 140 nm, 220 nm, and 300 nm over a refractive index of between 1.5 and 3. The average transmission is relatively unaffected by the lattice constant with a small decrease as lattice increases only noticeable above a refractive index of about 2.5. However, the refractive index produces a much greater effect with the transmission being above 75% at a refractive index of 3. FIG. 11B provides graph 1110 comparing the phase shift to the refractive index showing the lattice spacing of 220 nm provides a phase shift of a full 2π.

Figure 12A:
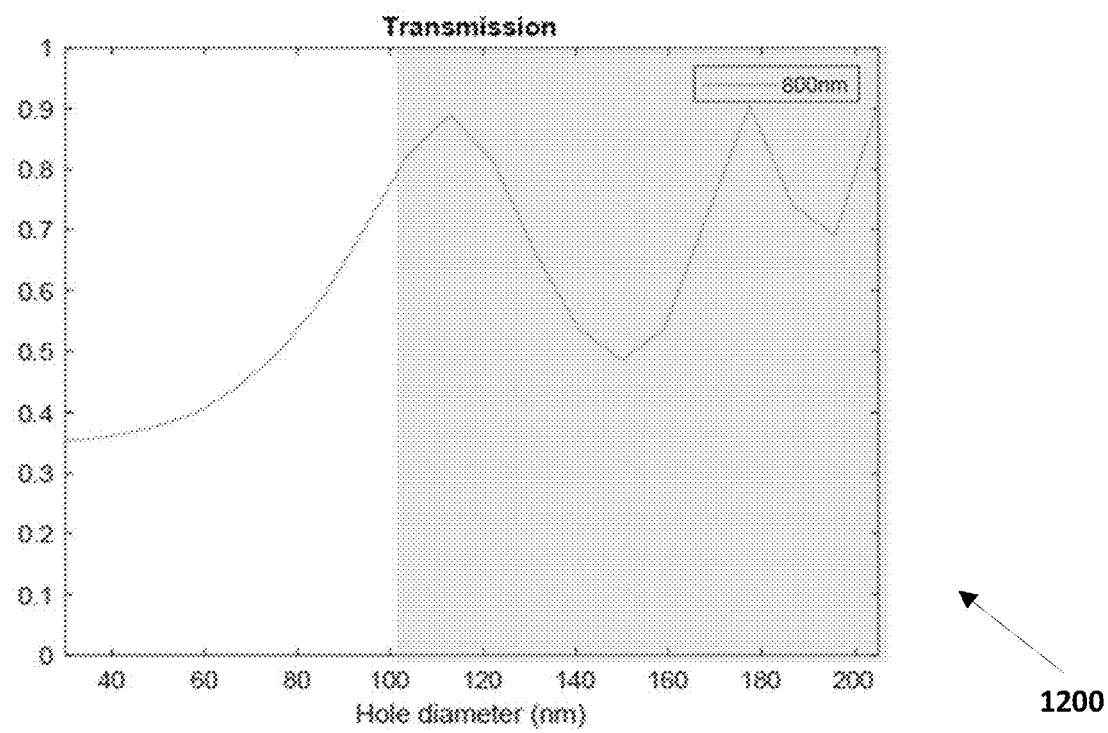
FIGS. 12A and 12B depict hole diameter versus the transmission and phase shift at a target wavelength of 800 nm according to various embodiments of the subject matter disclosed herein.
Figure 12B:
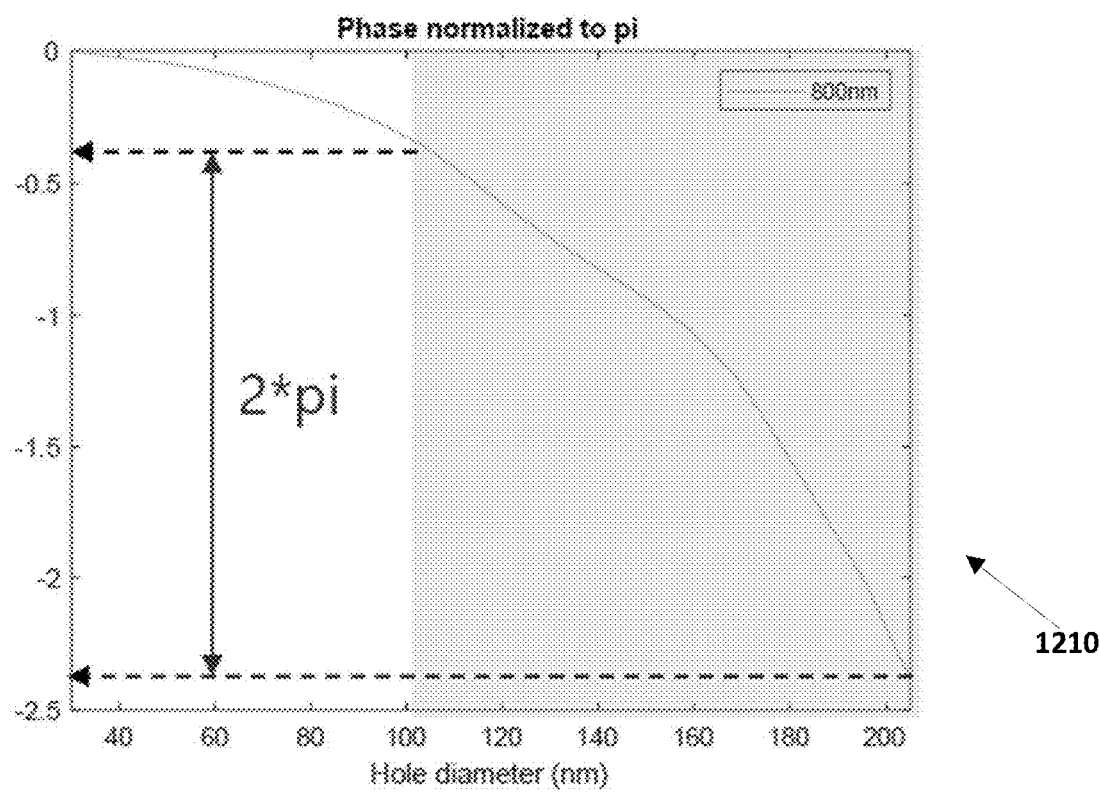

FIG. 12A and FIG. 12B respectively are graphs respectfully showing the effect of the hole diameter of a metalens element with respect to transmission and normalized phase shift for an example embodiment according to the subject matter as disclosed herein. The hole diameter may equal the width 116 of the metalens elements as shown in FIG. 1B. The example embodiment of FIG. 12A and 12B are in a silicon thin film substrate having a thickness of 600 nm, a refractive index of 3.69 at a target wavelength of 800 nm and maintain an aspect ratio between the hole diameter and hole depth of between 1:6 and 1:3. FIG. 12A shows a graph 1200 comparing the hole diameter with respect to transmission at a target wavelength of 800 nm. Transmission is depicted as increasing with increasing diameter up to a peak of about 90% transmission at a diameter of ~115 nm, before decreasing to a valley of around 50% transmission at a diameter of 150 nm, then increasing again to about 90% transmission at a diameter of about 175 nm, with a dip to ~70% transmission at a diameter of around 195 nm before reaching a diameter of 200 nm, which is a quarter of the target wavelength of 800 nm, with a transmission of about 90% at the target wavelength of 800 nm. FIG. 12B shows a graph 1210 comparing the hole diameter with respect to the phase shift normalized to $\pi$, showing a phase shift of about $\pi$ between ~100 and 200 nm. In this range, the transmission average over 72.7% for a phase shift of a full $2\pi$. The transmission may be further increased by increasing the aspect ratio of the holes, or by filling the holes with low refractive index materials. Furthermore, as depicted by FIG. 12A and FIG. 12B, a metalens using the hole approach may provide a trade-off between an optimized phase shift and an optimized transmission such that multiple metasurfaces may be desirable to optimize light towards the desired conditions in different regions or layers of the device.

Figure 13:
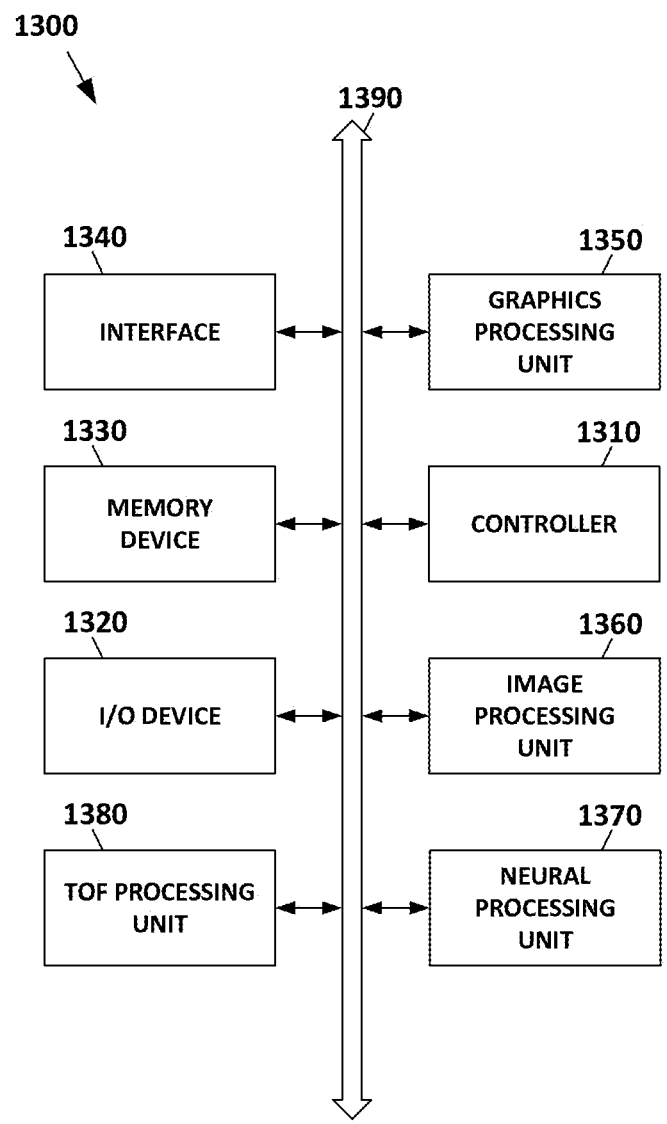
FIG. 13 depicts an example embodiment of an electronic device using a metalens according to the subject matter disclosed herein.

FIG. 13 depicts an electronic device 1300 that may be configured to provide an image sensor that includes a nanostructured metamaterial configured to be a thermal coating, window, or lens, according to the subject matter disclosed herein. Electronic device 1300 and the various system components of electronic device 1300 may be formed from one or modules. The electronic device 1300 may include a controller (or CPU) 1310, an input/output device 1320 such as, but not limited to, a keypad, a keyboard, a display, a touch-screen display, a 2D image sensor, a 3D image sensor, a memory 1330, an interface 1340, a GPU 1350, an imaging-processing unit 1360, a neural processing unit 1370, a TOF processing unit 1380 that are coupled to each other through a bus 1390. In one embodiment, the imaging-processing unit 1360 may include an array of imaging pixels in which at least one imaging pixel includes a metalens according to the subject matter disclosed herein. The controller 1310 may include, for example, at least one microprocessor, at least one digital signal processor, at least one microcontroller, or the like. The memory 1330 may be configured to store a command code to be used by the controller 510 and/or to store a user data.

The interface 1340 may be configured to include a wireless interface that is configured to transmit data to or receive data from, for example, a wireless communication network using a RF signal. The wireless interface 1340 may include, for example, an antenna. The electronic device 1300 also may be used in a communication interface protocol of a communication system, such as, but not limited to, Code Division Multiple Access (CDMA), Global System for Mobile Communications (GSM), North American Digital Communications (NADC), Extended Time Division Multiple Access (E TDMA), Wideband CDMA (WCDMA), CDMA2000, Wi Fi, Municipal Wi Fi (Muni Wi Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash OFDM), IEEE 802.20, General Packet Radio Service (GPRS), iBurst, Wireless Broadband (WiBro), WiMAX, WiMAX-Advanced, Universal Mobile Telecommunication Service—Time Division Duplex (UMTS TDD), High Speed Packet Access (HSPA), Evolution Data Optimized (EVDO), Long Term Evolution—Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively, or additionally, the program instructions can be encoded on an artificially generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A metalens, comprising:
   a first thin-film layer comprising a first index of refraction; and
   a first embedded layer within the first thin-film layer and comprising a second index of refraction, a ratio of the second index of refraction to the first index of refraction being greater than or equal to 1.5 and less than or equal to 3.0; and
   wherein the first embedded layer fills a plurality of holes in the first thin-film layer, and wherein the plurality of holes have a lattice spacing of substantially half a predetermined target wavelength between each other.

2. The metalens of claim 1, wherein the metalens further comprises a second thin-film layer having a third index of refraction and a second embedded layer having a fourth index of refraction, the second embedded layer being within the second thin-film layer, and
   wherein a ratio of the fourth index of refraction to the second index of refraction is greater than or equal to 1.5 and less than or equal to 3.0.

3. The metalens of claim 2, wherein the metalens further comprises a third thin-film layer having a fifth index of refraction and a third embedded layer having a sixth index of refraction, the third embedded layer being within the third thin-film layer, and
   wherein a ratio of the sixth index of refraction to the fifth index of refraction is greater than or equal to 1.5 and less than or equal to 3.0.

4. The metalens of claim 2, wherein the metalens further comprises a third thin-film layer having a fifth index of refraction and a liquid-crystal embedded layer within the third thin-film layer, and
   wherein the liquid-crystal embedded layer comprises a first state and a second state, the first state comprising a sixth index of refraction and a ratio of the sixth index of refraction to the fifth index of refraction being greater than or equal 1.5 and less than or equal 3, and the second state comprising a seventh index of refraction and a ratio of the seventh index of refraction to the fifth index of refraction being less than or equal to 1.5.

5. The metalens of claim 4, wherein the third thin-film layer is between the first thin-film layer and the second thin-film layer, and
   wherein a light path between the first thin-film layer and the second thin-film layer changes based on the liquid-crystal embedded layer changing from the first state to the second state.

6. The metalens of claim 1, wherein the metalens transmits a predetermined range of wavelengths of light that is incident upon the metalens.

7. The metalens of claim 1, wherein the metalens transmits light with a critical ray angle relative to a normal of a surface of the first thin-film layer of between 0 degrees and 45 degrees inclusive.

8. The metalens of claim 1, further comprising an imaging pixel, wherein the metalens is disposed between the imaging pixel and an imaging target.

9. The metalens of claim 8, wherein the metalens comprises at least a first array of metalenses, and
   further comprising an array of imaging pixels, each imaging pixel comprising a corresponding metalens disposed between the imaging pixel and the imaging target.

10. The metalens of claim 8, wherein at least one metalens comprises a field of view that includes an active area and a circuit area for the imaging pixel, and wherein the at least one metalens focuses incident light onto the active area of the imaging pixel.

11. The metalens of claim 1, wherein the first embedded layer fills a hole in the first thin-film layer, and wherein a ratio of a depth of the hole in the first thin-film layer to a width of the hole in the first thin-film layer is between 1:1 and 1:10 inclusive.

12. An optoelectrical device, comprising:
    a unit pixel comprising a metalens and an image sensor, the metalens comprising a first thin-film layer with a first index of refraction and a first embedded layer within the first thin-film layer and comprising a second index of refraction, the first embedded layer filling a first plurality of holes in the first thin-film layer; and
    wherein a ratio of a depth of the first plurality of holes in the first thin-film layer to a width of the first plurality of holes in the first thin-film layer is less than or equal to 1:20.

13. The optoelectrical device of claim 12, wherein a ratio of the second index of refraction to the first index of refraction is greater than or equal to 1.5 and less than or equal to 3.

14. The optoelectrical device of claim 12, wherein the ratio of the depth of the first plurality of holes in the first thin-film layer to the width of the first plurality of holes in the first thin-film layer is between 1:3 and 1:6.

15. The optoelectrical device of claim 12, wherein the first plurality of holes have a lattice spacing of substantially half a predetermined target wavelength between each other.

16. The optoelectrical device of claim 12, wherein the metalens transmits a predetermined range of wavelengths of light that is incident upon the metalens.

17. The optoelectrical device of claim 12, wherein the metalens transmits light with a critical ray angle relative to a normal of a surface of the first thin-film layer of between 0 degrees and 45 degrees, inclusive.

18. The optoelectrical device of claim 12, wherein the metalens further comprises a second thin-film film layer having a third index of refraction and a second embedded layer having a fourth index of refraction, the second embedded layer filling a second plurality of holes in the second thin-film layer;
    a third thin-film layer having a fifth index of refraction and a liquid-crystal embedded layer within the third thin-film layer, the liquid-crystal embedded layer filling a third plurality of holes in the third thin-film film layer; and
    wherein the first plurality of holes, the second plurality of holes, and the third plurality of holes each have a lattice spacing of substantially half a predetermined target wavelength.

19. The optoelectrical device of claim 18, wherein the liquid-crystal embedded layer comprises a first state and a second state, the first state comprising a sixth index of refraction and a ratio of the sixth index of refraction to the fifth index of refraction being greater than or equal 1.5 and less than or equal 3, and the second state comprising a seventh index of refraction and a ratio of the seventh index of refraction to the fifth index of refraction being less than or equal to 1.5.

* * * * *